(12) United States Patent
Kanisawa

(10) Patent No.: US 7,857,028 B2
(45) Date of Patent: Dec. 28, 2010

(54) MOUNTING DEVICE FOR ELECTRICAL COMPONENT

(75) Inventor: Shiyuki Kanisawa, Utsunomiya (JP)

(73) Assignees: Sony Corporation, Tokyo (JP); Sony Chemical & Information Device Corp., Tokyo (JP)

(*) Notice: Subject to any disclaimer, the term of this patent is extended or adjusted under 35 U.S.C. 154(b) by 110 days.

(21) Appl. No.: 11/882,049

(22) Filed: Jul. 30, 2007

(65) Prior Publication Data
US 2008/0035274 A1 Feb. 14, 2008

Related U.S. Application Data

(63) Continuation of application No. PCT/JP2006/301202, filed on Jan. 26, 2006.

(30) Foreign Application Priority Data
Feb. 2, 2005 (JP) ............... 2005-026787

(51) Int. Cl.
*B30B 15/34* (2006.01)
(52) U.S. Cl. ............ 156/583.3; 156/581; 156/580
(58) Field of Classification Search ........... 156/583.3, 156/581, 580
See application file for complete search history.

(56) References Cited

U.S. PATENT DOCUMENTS 4,875,966 A * 10/1989 Perko ............... 156/580
5,186,632 A * 2/1993 Horton et al. ............ 439/67
6,484,776 B1 * 11/2002 Meilunas et al. ........... 156/382
2006/0113356 A1 6/2006 Matsumura et al.

FOREIGN PATENT DOCUMENTS

| DE | 42 33 073 A1 | 4/1994 |
|---|---|---|
| JP | A-2000-068633 | 3/2000 |
| JP | A-2000-79611 | 3/2000 |
| JP | A-2002-359264 | 12/2002 |
| JP | A-2003-077953 | 3/2003 |
| JP | A-2003-86635 | 3/2003 |
| JP | A-2003-258413 | 9/2003 |
| JP | 2003298226 | * 10/2003 |
| JP | A-2004-014883 | 1/2004 |
| JP | A-2005-032952 | 2/2005 |
| WO | WO 2005/006430 A1 | 1/2005 |
| WO | WO 2006/082744 A1 | 8/2006 |

OTHER PUBLICATIONS

European Patent Office, *European Search Report for Application No. EP 06 71 2384*, dated Jan. 11, 2010.

* cited by examiner

Primary Examiner—Khanh Nguyen
Assistant Examiner—John Blades
(74) Attorney, Agent, or Firm—Oliff & Berridge, PLC

(57) ABSTRACT

A mounting device for an electric component includes a thermocompression bonding head with a pressure bonding member made of a predetermined elastomer, the pressure bonding member provided in a head main body, and a pressing force adjusting mechanism for adjusting a pressing force corresponding to a region on a pressure bonding surface of the pressure bonding member, wherein the pressure bonding member is pressed at a predetermined pressure toward an electric component placed on a wiring board.

3 Claims, 5 Drawing Sheets

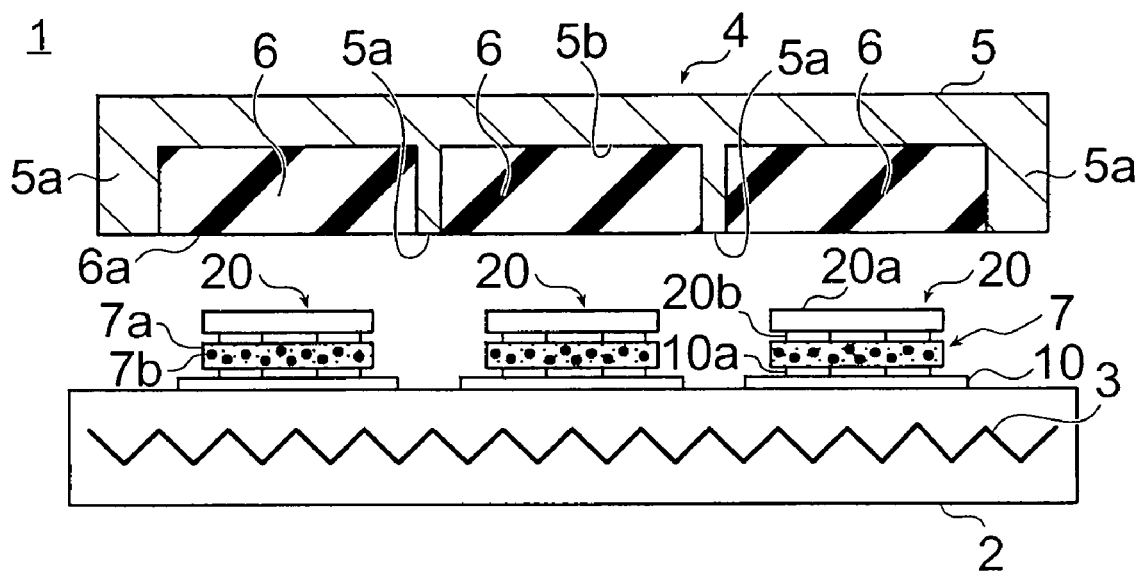
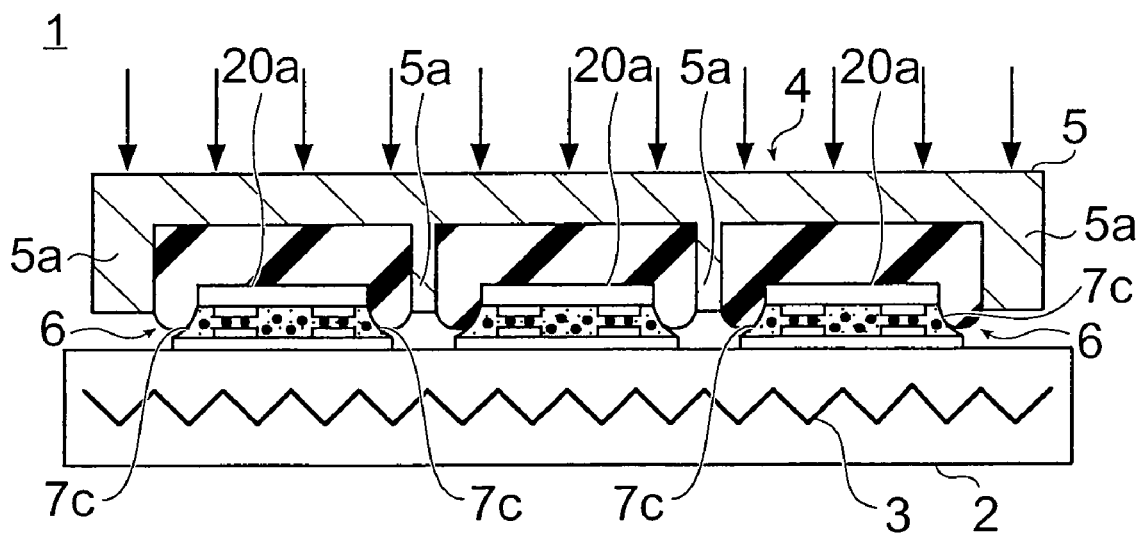

MOUNTING DEVICE FOR ELECTRICAL COMPONENT

CROSS-REFERENCE TO RELATED APPLICATIONS

This application is a Continuation of International Application No. PCT/JP2006/301202, filed Jan. 26, 2006, which claims priority from Japanese Patent Application No. 2005-026787, filed Feb. 2, 2005. The disclosure of the prior application is hereby incorporated by reference in its entirety.

BACKGROUND

The present invention relates generally to techniques for mounting electrical components.

A method using an anisotropic conductive adhesive film in which conductive particles are dispersed in a binder is known for directly mounting a bear chip on a wiring board such as a printed wiring board. In the mounting method using the anisotropic conductive adhesive film, after an IC chip is placed on a board to which the anisotropic conductive adhesive film adheres, pressure/heat is applied to the IC chip by a flat ceramic, metal or other pressure bonding head to cure the anisotropic conductive adhesive film. This is known as mounting by thermocompression bonding.

One problem associated with such a method that involves applying pressure/heat using a metal or other pressure bonding head is that a fillet portion of an adhesive agent around the IC chip does not become sufficiently heated during the thermocompression bonding, thereby reducing connection reliability. Another problem associated with thermocompression bonding is that it is difficult to mount a plurality of IC chips.

Consequently, in order to solve these problems, techniques have been proposed in recent years that perform thermocompression bonding of IC chips using a thermocompression bonding head made of an elastic body such as silicone rubber (for example, see JP 2000-79611A and JP 2002-359264A).

SUMMARY

However, these techniques cannot achieve sufficient connection between the IC chip and the board because a sufficient pressurizing force is not applied to a portion between bumps and patterns. As a result, the initial conduction resistance and the connection reliability after aging cannot be sufficiently secured.

Another disadvantage of a method that involves applying pressure/heat using a thermocompression bonding head made of an elastic body is that displacement occurs between the IC chip and the board during pressure bonding. The extent of the displacement tends to increase when a plurality of IC chips are mounted at one time.

The disclosure thus provides, among other things, a mounting device that can mount a plurality of electrical components with an adhesive agent in a highly reliable manner that solves the problems associated with conventional techniques.

According to an aspect of the invention, there is provided a mounting device for an electric component that includes a thermocompression bonding head that includes a pressure bonding member made of a predetermined elastomer that is provided in a head main body, and a pressing force adjusting mechanism for adjusting a pressing force corresponding to a region on a pressure bonding surface of the pressure bonding member, wherein the pressure bonding member is pressed at a predetermined pressure towards an electric component placed on a wiring board.

According to an aspect of the invention, the pressing force adjusting mechanism includes a plurality of frame-shaped pressing force adjusting portions provided in the head main body, and the pressure bonding member is disposed inside the pressing force adjusting portions.

According to an aspect of the invention, the pressing force adjusting mechanism includes a pressing force adjusting portion in the form of a protrusion, provided in the head main body.

According to an aspect of the invention, the heights of the pressing force adjusting portions are differentiated.

According to an aspect of the invention, the pressing force adjusting mechanism is buried in the pressure bonding member.

According to an aspect of the invention, the pressing force adjusting mechanism includes a cut portion in the pressure bonding member.

According to an aspect of the invention, the pressing force adjusting mechanism comprises a plurality of the pressure bonding members integrally connected.

According to an aspect of the invention, the mounting device includes a base for supporting the wiring board, and a heater provided in the base.

According to an aspect of the invention, when an electrical component is pressed by a pressure bonding member made of a predetermined elastomer during thermocompression bonding, while a region on the pressed side of the electrical component (for example, a top region opposing the pressure bonding member) is pressed at a predetermined pressure toward the wiring board, a region on the lateral sides of the electrical component is pressed at a smaller pressure than the pressure applied to the region on the pressed side.

As a result, sufficient pressure can be applied to a connection portion of the electrical component and the wiring board, and to a fillet portion around the electrical component so as to prevent generation of voids. Accordingly, connection of IC chips, etc. can be performed in a highly reliable manner using an anisotropic conductive adhesive film, for example.

According to an aspect of the invention, a pressing force adjusting mechanism for adjusting the pressing force for each of various regions on a pressure bonding surface of the pressure bonding member is provided, such that when pressing a plurality of electrical components simultaneously with respective pressure bonding portions, it is possible to press regions on the pressed side and the lateral sides of each electrical component respectively with an optimal force. This results in highly reliable mounting and avoids displacement between each electrical component and the board during the pressure bonding.

According to an aspect of the invention, the pressing force adjusting mechanism comprises a plurality of frame-shaped pressing force adjusting portions in the head main body. When the pressure bonding member is arranged inside these pressing force adjusting frame portions, regions on the lateral sides of an electrical component are pressed with a smaller pressure than regions on the pressed side of the electrical component. In addition, since fine adjustment of the materials, hardness degree, and other properties of the pressure bonding member in the pressing force adjusting frame portions is possible, displacement can be reliably prevented when a large number of electrical components are mounted simultaneously.

According to an aspect of the invention, if a pressing force adjusting portion in the form of protrusion is provided in the head main body as the pressing force adjusting mechanism, and/or the pressing force adjusting portions are configured such that the heights of the pressing force adjusting portions are differentiated, the pressing force applied to each of various regions on the pressure bonding surface of the pressure bonding member can be optimized. Consequently, it is possible to perform more reliable thermocompression bonding for a plurality of electrical components simultaneously by avoiding positional displacement of the electrical components.

According to an aspect of the invention, the pressing force adjusting mechanism is buried in the pressure bonding member and pressure bonding can be performed even when the electrical component is located directly below the pressing force adjusting mechanism. Consequently, smooth pressing can be performed in various regions on the pressure bonding surface. As a result, it is not necessary to prepare the thermocompression bonding head based on the number, allocation position, size or the like of the electrical component, and thermocompression bonding can be performed for a plurality of electrical components of various types simultaneously, without the disadvantage of positional displacement of the various electrical components.

According to an aspect of the invention, a cut portion is provided in the pressure bonding member as the pressing force adjusting mechanism such that only the portion of the pressure bonding member contacting the electrical component is compressed without the pressing force being transmitted to adjacent portions beyond the cut portion. Consequently, positional displacement of the electrical component is prevented without the use of a frame portion.

According to an aspect of the invention, the pressing force adjusting mechanism comprises a plurality of pressure bonding members integrally formed. A gap similar to the cut portion described above can be formed in the pressure bonding member, so as to prevent positional displacement of the electrical component without the use of a frame portion.

According to an aspect of the invention, a plurality of electrical components can be mounted with an adhesive agent with a high degree of reliability.

BRIEF DESCRIPTION OF THE DRAWINGS

Exemplary aspects of the invention will be described with reference to the drawings, wherein:

FIGS. 2(a) and 2(b) are processing diagrams illustrating an example of a mounting method using a mounting device in accordance with an embodiment of the invention;

DETAILED DESCRIPTION OF EMBODIMENTS

Embodiments of a mounting device for electrical components in accordance with the invention will be described in detail through reference to the drawings.

Figure 1A:
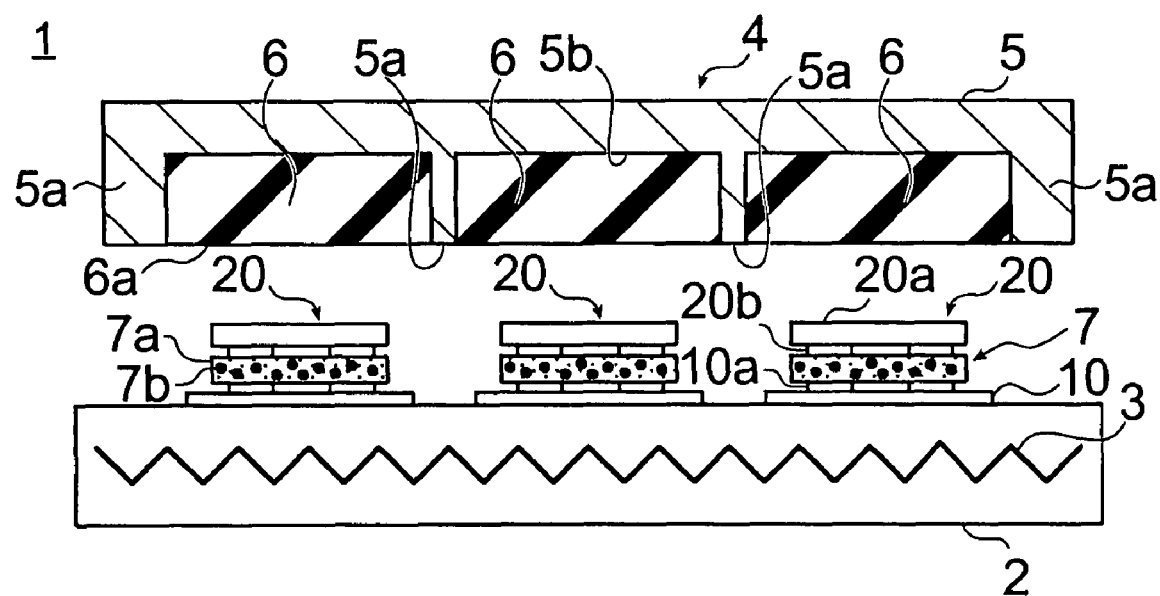
FIG. 1(a) is a vertical cross-sectional view of a mounting device in accordance with an embodiment of the invention.
Figure 1B:
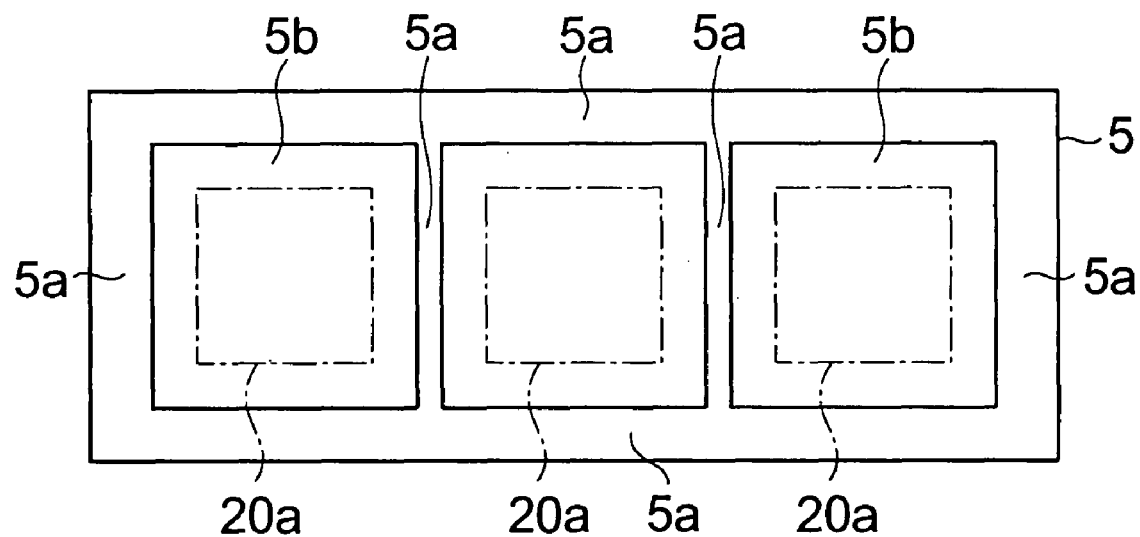
FIG. 1(b) is a horizontal cross-sectional view of a mounting device in accordance with the invention illustrating the positional relationship between a thermocompression bonding head of the mounting device and IC chips.

FIG. 1(a) is a cross-sectional view of a mounting device in accordance with an embodiment of the invention, and FIG. 1(b) is an explanatory diagram illustrating the positional relationship between a thermocompression bonding head of the mounting device and IC chips.

As shown in FIGS. 1(a) and 1(b), in accordance with an embodiment of the invention, a mounting device 1 includes a base 2 that holds a wiring board 10 on which a wiring pattern 10a is formed, and a thermocompression bonding head 4 for applying pressure and heat to an IC chip (electrical component) 20 having a bump 20b.

The base 2 is made of a predetermined metal and a heater 3 for heating is provided inside the base 2.

The thermocompression bonding head 4 includes a head main body 5 made of a predetermined metal, and a heater (not shown) for heating is provided inside thereof.

At a surface of the head main body 5 opposing the base 2, a plurality of pressing force adjusting frames (pressing force adjusting mechanism) 5a are provided so as to correspond to a plurality of IC chips 20. Concave portions 5b are located between the pressing force adjusting frames 5a.

In accordance with an embodiment of the invention, pressure bonding members 6 made of a plate-shaped elastomer are attached to the inner wall of the concave portions 5b.

The pressure bonding member 6 is disposed such that a flat pressure bonding surface 6a is in a substantially horizontal position. The pressure bonding surface 6a of the pressure bonding member 6 is configured to have a larger area than the area of a top portion 20a of the IC chip 20 so as to apply uniform force to the top portion 20a.

It is preferable that the thickness of the pressure bonding member 6 is equal to or larger than the thickness of the IC chip 20 in order to apply an optimal pressure to the top portion 20a and a fillet portion 7c (described later) on the lateral sides of the IC chip 20.

The type of elastomer used for the pressure bonding member 6 is not limited. However, it is preferable to use an elastomer whose rubber hardness degree is not less than 40 and not more than 80 to improve connection reliability.

Elastomers having a rubber hardness degree of less than 40 do not apply sufficient pressure to the IC chip 20. As a result, the initial resistance and connection reliability become poor. If the pressure bonding member is made from an elastomer with a rubber hardness degree of more than 80, insufficient pressure is applied to the fillet portion. This generates voids in a binder resin of an adhesive agent, thereby making the connection reliability poor.

The rubber hardness degree is taken according to JIS S 6050 (room temperature as temperature condition: 5 to 35° C.).

The method used for measuring the rubber hardness degree according to JIS S 6050 is described as follows.

Using a spring hardness testing machine whose pressing needle has a hemispheric shape with a diameter of 5.08±0.02 mm, a pressing surface of the pressing needle is brought into contact with a surface of a horizontally-retained test piece, with the pressing needle of the testing machine being kept vertical to the surface of the test piece, and a gauge is immediately read in a positive number.

The entire surface of the test piece is equally divided into three areas, and measurement is performed at a single spot in the central portion for each area. The median value of the measured values is taken as the hardness of the test piece.

Note 1: The height of the pressing needle is 2.54±0.02 mm when the gauge indicates "0," and 0 mm when the gauge indicates "100."

Note 2: the relation between the gauge and the spring force (N) is as follows: the spring force (N) is 0.54 when the gauge indicates "0," 1.32 when the gauge indicates "10," 2.11 when the gauge indicates "20," 2.50 when the gauge indicates "25," 2.89 when the gauge indicates "30," 3.68 when the gauge indicates "40," 4.46 when the gauge indicates "50," 5.25 when the gauge indicates "60," 6.03 when the gauge indicates "70,"0 6.42 when the gauge indicates "75," 6.82 when the gauge indicates "80," 7.60 when the gauge indicates "90," and 8.39 when the gauge indicates "100."

During experimentation, the inventors confirmed that when the pressure bonding member 6 was heated from room temperature to 240° C., the rubber hardness degree of the elastomer of the pressure bonding member 6 showed very little change (approximately ±2).

The elastomer may be natural rubber or synthetic rubber. Preferably, the elastomer is silicone rubber for its heat resistance and pressure resistance properties.

FIGS. 2(a) and 2(b) are processing diagrams illustrating an example of a mounting method using a mounting device in accordance with an embodiment of the invention.

Referring to FIG. 2(a), the wiring board 10 is disposed on the base 2, and an anisotropic conductive adhesive film 7 is placed on the wiring board 10. The anisotropic conductive adhesive film 7 is formed by dispersing conductive particles 7b in binder resin 7a.

It should be noted that if the amount of the conductive particles 7b dispersed in the binder resin 7a is small, the melt viscosity of the adhesive film 7 is not affected by the presence/absence of the dispersed conductive particles 7b.

The IC chip 20 is placed on this anisotropic conductive adhesive film 7 and the pressure bonding surface 6a of the thermocompression bonding head 4 is pressed against the top portion 20a of the IC chip 20 via a protective film (not shown) to perform temporary pressure bonding under predetermined conditions. Further, pressure bonding is performed under the conditions described below.

To reliably prevent the generation of voids by sufficiently heating the fillet portion 7c around the IC chip 20, it is preferable that the IC chip 20 side is heated at a predetermined temperature and the wiring board 10 side is heated at a temperature higher than the above predetermined temperature during the pressure bonding.

Specifically, the heater of the thermocompression bonding head 4 is controlled such that the temperature of the pressure bonding member 6 is set to approximately 100° C., and the heater 3 of the base 2 is controlled such that the temperature of the binder resin 7a of the anisotropic conductive adhesive film 7 is set to approximately 200° C.

In this way, during the thermocompression bonding, the anisotropic conductive adhesive film 7 is heated so that its melt viscosity is not less than $1.0 \times 10^2$ mPa·s and not more than $1.0 \times 10^5$ mPa·s.

If the melt viscosity of the anisotropic conductive adhesive film 7 during thermocompression bonding is less than $1.0 \times 10^2$ mPa·s, the fluidity of the binder resin 7a during thermocompression bonding is large, generating voids and making the initial resistance and the connection reliability poor. If the melt viscosity of the anisotropic conductive adhesive film 7 is more than $1.0 \times 10^5$ mPa·s, the binder resin 7a cannot fully be eliminated at the connecting portion during thermocompression bonding, thereby generating voids and making the initial resistance and the connection reliability poor.

During the thermocompression bonding, the pressure applied to each IC chip 20 is approximately 100 N for about 15 seconds.

As shown in FIG. 2(b), while the top portion 20a of the IC chip 20 is pressed toward the wiring board 10 with a predetermined pressure by pressurizing the pressure bonding member 6 made of an elastomer, the fillet portions 7c at the lateral sides of the IC chip 20 also can be pressed with a pressure that is smaller than the pressure applied to the top portion 20a. Accordingly, a sufficient pressure can be applied to the connecting portion of the IC chip 20 and the wiring board 10, and to the fillet portion 7c around the IC chip 20 such that no voids are generated.

As a result, in accordance with an embodiment of the invention, highly reliable connection of the IC chip 20 or the like can be obtained using the anisotropic conductive adhesive film 7.

Furthermore, in accordance with an embodiment of the invention, the pressing force of each pressure bonding member 6 is adjusted by the pressing force adjusting frames 5a, such that the top portion 20a and the lateral sides of each IC chip can be pressed with an optimal pressure (particularly, uniform force can be applied to the lateral sides of the IC chip 20), when a plurality of IC chips 20 are pressed by the respective pressure bonding members 6 at a time. As a result, in this embodiment it is possible to prevent displacement between each IC chip 20 and the board 10 during pressure bonding, thereby making the mounting highly reliable.

FIGS. 3-6 are schematic construction diagrams illustrating other embodiments of the invention. Elements described in reference to FIGS. 1(a)-2(b) are assigned the same reference numerals and detailed description thereof is omitted.

Figure 3:
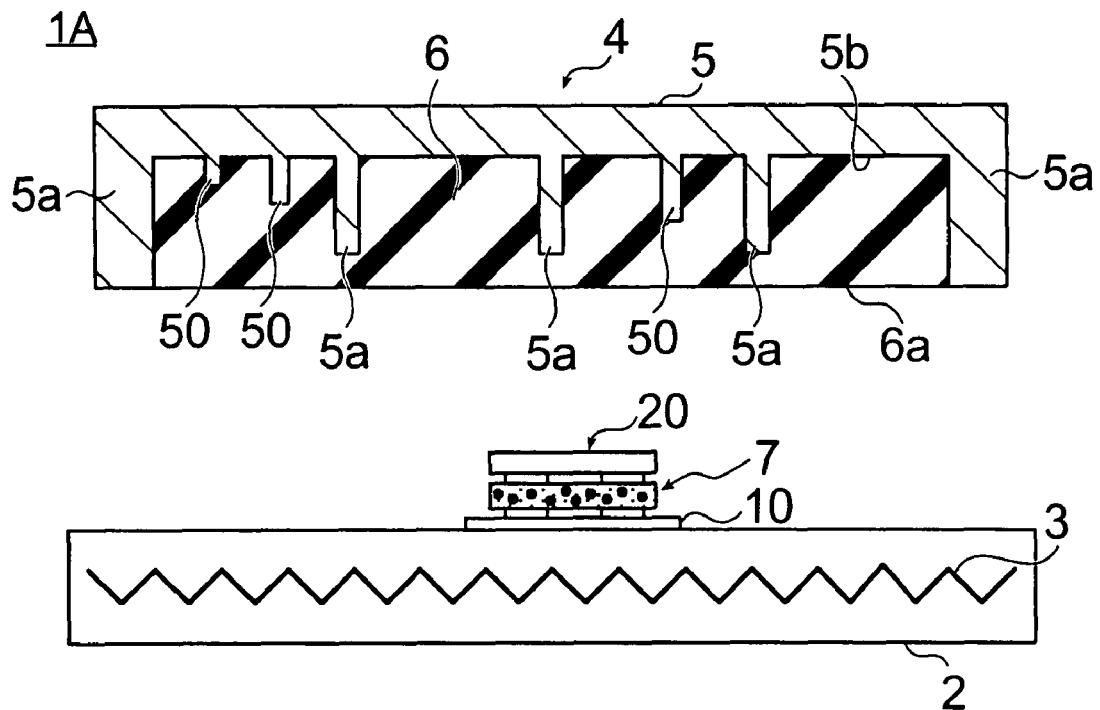
FIG. 3 is a schematic construction diagram of an embodiment of the invention.

A mounting apparatus 1A in accordance with an embodiment of the invention is shown in FIG. 3. The head main body 5 includes a plurality of pressing force adjusting frames 5a extending from the concave portion 5b of the head main body 5. In this embodiment of the invention, the pressing force adjusting frames 5a are buried inside the pressure bonding member 6 that is integrally formed inside the concave portion 5b.

In addition, positioned between the pressing force adjusting frames 5a are pressing force adjusting frames 50 having shorter lengths than the lengths of the pressing force adjusting frames 5a, and the lengths of pressing force adjusting frames 50 are differentiated.

According to this embodiment, by changing the position and the length of the pressing force adjusting frames 5a and 50, the pressing force can be adjusted for various regions on the pressure bonding surface 6a of the pressure bonding member 6.

In accordance with this embodiment, because it is possible to perform pressure bonding even when the IC chip 20 and the wiring board 10 are directly below the pressing force adjusting frame 5a, smooth pressing can be performed in various regions on the pressure bonding surface 6a. As a result, it is not required to prepare the thermocompression bonding heads 4 based on the number, allocation position, size or the like of the IC chip 20, and thermocompression bonding can be performed for a plurality of IC chips 20 simultaneously while preventing positional displacement of the IC chips 20.

Figure 4:
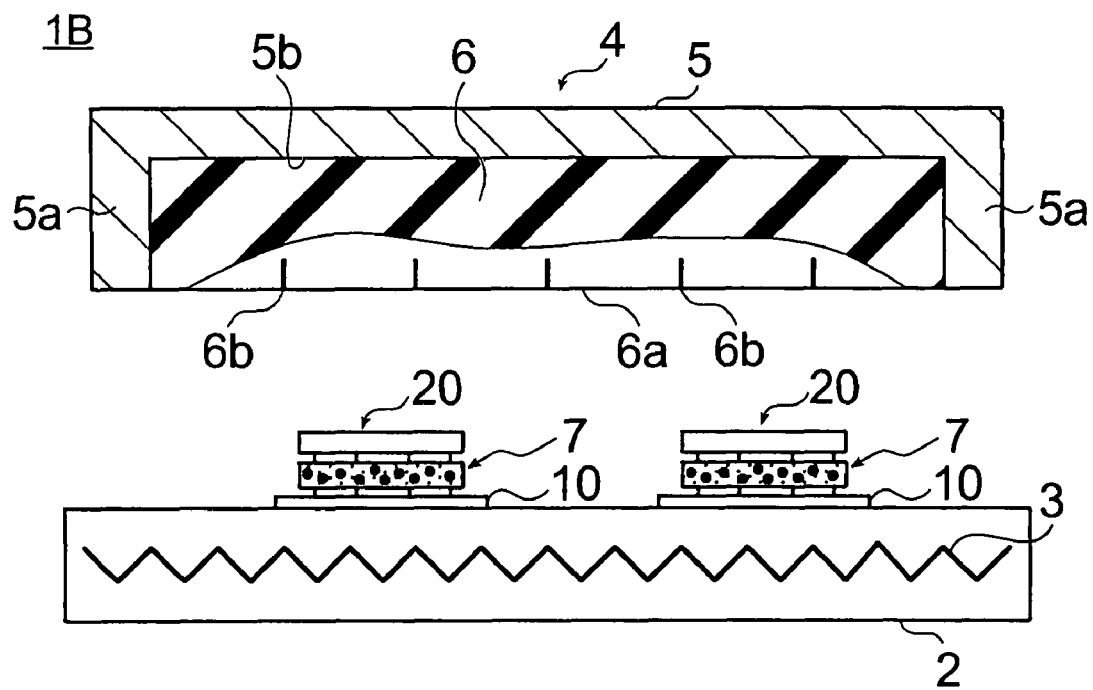
FIG. 4 is a schematic construction diagram of another embodiment of the invention.

Referring to FIG. 4, in accordance with an embodiment of the invention, mounting device 1B includes a cut portion 6b as a pressing force adjusting mechanism at the pressure bonding surface 6a of the pressure bonding member 6 that is attached inside the concave portion 5b of the head main body 5.

In this embodiment, a plurality of the cut portions 6b are provided at predetermined intervals. By changing the number, orientation and depth of the cut portions 6b, the pressing force can be adjusted corresponding to each of various regions on the pressure bonding surface 6a of the pressure bonding member 6.

For example, when the IC chip 20 is pressed by a portion of the pressure bonding surface 6a other than the cut portion 6b, only the direct pressing portion of the pressure bonding surface 6a can be compressed without the pressing force being transmitted to adjacent portions of pressure bonding surface 6a beyond the cut portion 6b.

It should be noted that the gap formed in the cut portion 6b is narrow. Therefore, even when the IC chip 20 is placed directly below the cut portion 6b, the IC chip 20 is not displaced during thermocompression bonding and smooth pressing can be performed at each of various regions on the pressure bonding surface 6a.

An advantage of this embodiment of the invention is that it is not necessary to prepare the thermocompression bonding heads 4 based on the number, allocation position, size or the like of the IC chip 20. A further advantage is that thermocompression bonding can be performed for a plurality of IC chips 20 simultaneously without positional displacement of the IC chips 20.

Figure 5:
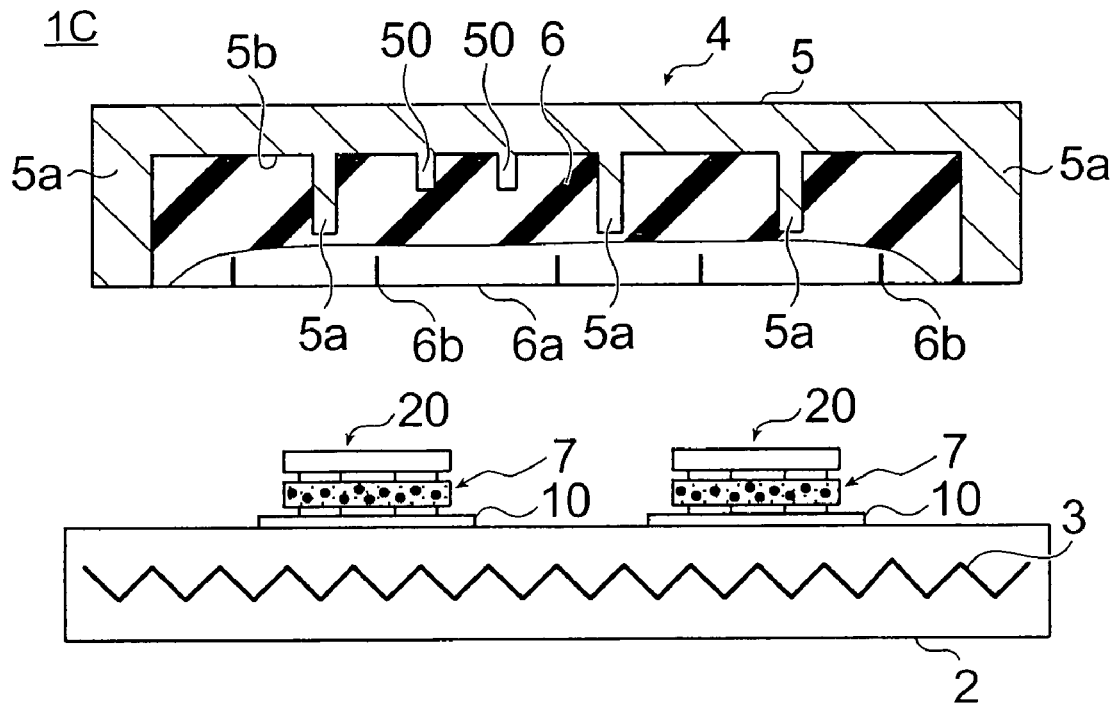
FIG. 5 is a schematic construction diagram of another embodiment of the invention.

A mounting device IC in accordance with an embodiment of the invention is shown in FIG. 5 and combines features of the embodiment shown in FIG. 3 and the embodiment shown in FIG. 4.

According to this embodiment, the pressing force adjusting frames 5a and 50 are buried inside the pressure bonding member 6 provided in the concave portion 5b of the head main body 5. Cut portions 6b are provided in the pressure bonding surface 6a of the pressure bonding member 6.

According to this embodiment, it is not required to prepare the thermocompression bonding head 4 based on the number, allocation position, size or the like of the IC chip 20, and thermocompression bonding can be performed for a plurality of IC chips 20 simultaneously while avoiding positional displacement of the IC chips 20.

Because the pressing force adjusting frames 5a and 50 of the head main body 5 and the cut portions 6b of the pressure bonding member 6 are used jointly to form the pressing force adjusting mechanism, it is possible to finely adjust the pressing force applied by various regions on the pressure bonding surface 6a of the pressure bonding member 6.

Figure 6:
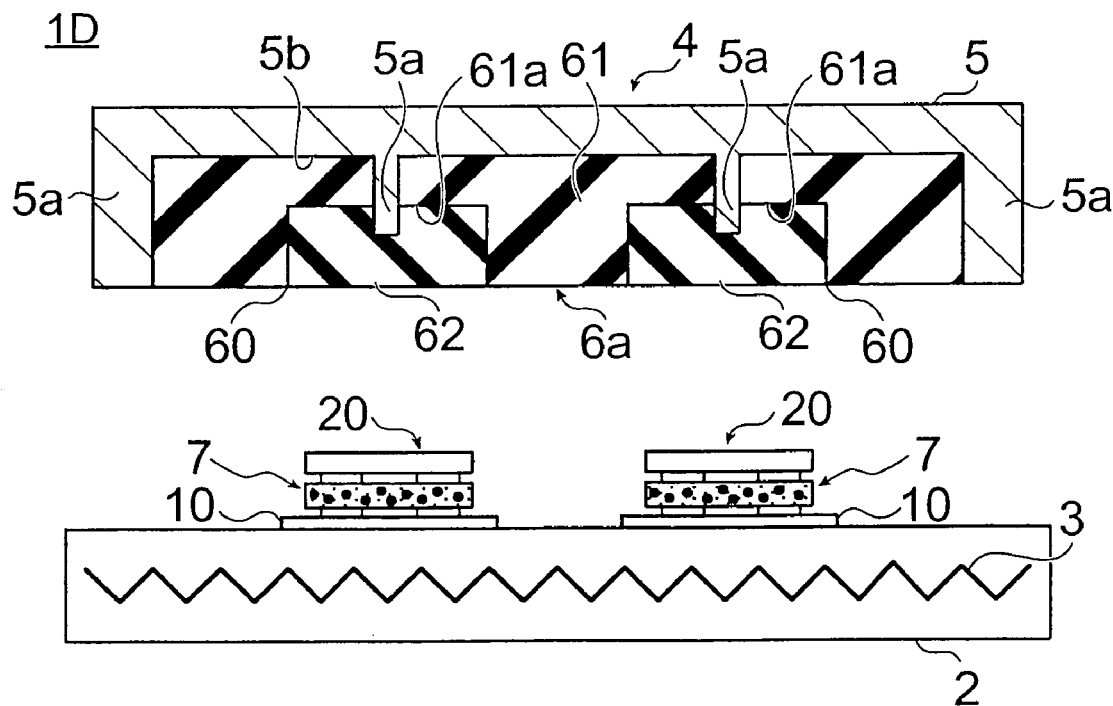
FIG. 6 is a schematic construction diagram of another embodiment of the invention.

Referring to FIG. 6, in accordance with an embodiment of the invention, mounting device 1D includes adjusting frames 5a buried inside a plurality of pressure bonding members 61 and 62 provided in the concave portion 5b of the head main body 5. The plurality of two types of pressure bonding members 61 and 62 are integrated to form a flat pressure bonding surface 6a.

A rectangular parallelepiped-shaped concave portion, for example, is formed in the first pressure bonding member 61 of the concave portion 5b of the head main body 5, and the second pressure bonding member 62 having the same shape as the concave portion formed in the first pressure bonding member 61 is fitted into the concave portion, thereby forming the flat pressure bonding surface 6a.

In accordance with this embodiment, the second pressure bonding member 62 is penetrated by the pressing force adjusting frames 5a of the head main body 5 to be supported by the same, and fixed with an adhesive agent, for example, to an interface 61a of the first pressure bonding member 61 and the second pressure bonding member 62 on the side of the concave portion 5a of the head main body 5. A gap 60 is formed between a lateral side surface of the second pressure bonding member 62 and a lateral surface of the first pressure bonding member 61.

The gap 60 is similar to the cut portion 6b of an embodiment of the invention discussed earlier and thus has the similar advantage of being able to prevent positional displacement of the IC chip 20 without the need for a frame portion.

The gap 60 is narrow such that even when the IC chip 20 is placed directly below the gap 60, the IC chip 20 is not displaced during thermocompression bonding.

In order to improve connection reliability, it is preferable to make the second pressure bonding member 62 from a material whose rubber hardness degree is lower than that of the first pressure bonding member 61.

According to this embodiment, it is not required to prepare the thermocompression bonding head 4 based on the number, allocation position, size or the like of the IC chip 20, and thermocompression bonding can be performed for a plurality of IC chips 20 simultaneously without positional displacement of the IC chips 20.

The invention is not limited to the above-described embodiments and various modifications are possible.

For example, in the above-described embodiments, frame-shaped pressing force adjusting portions are provided as the pressing force adjusting mechanism in the head main body. However, the invention is not limited to this and the pressing force adjusting portion can be a protrusion as described below.

Figure 7A:
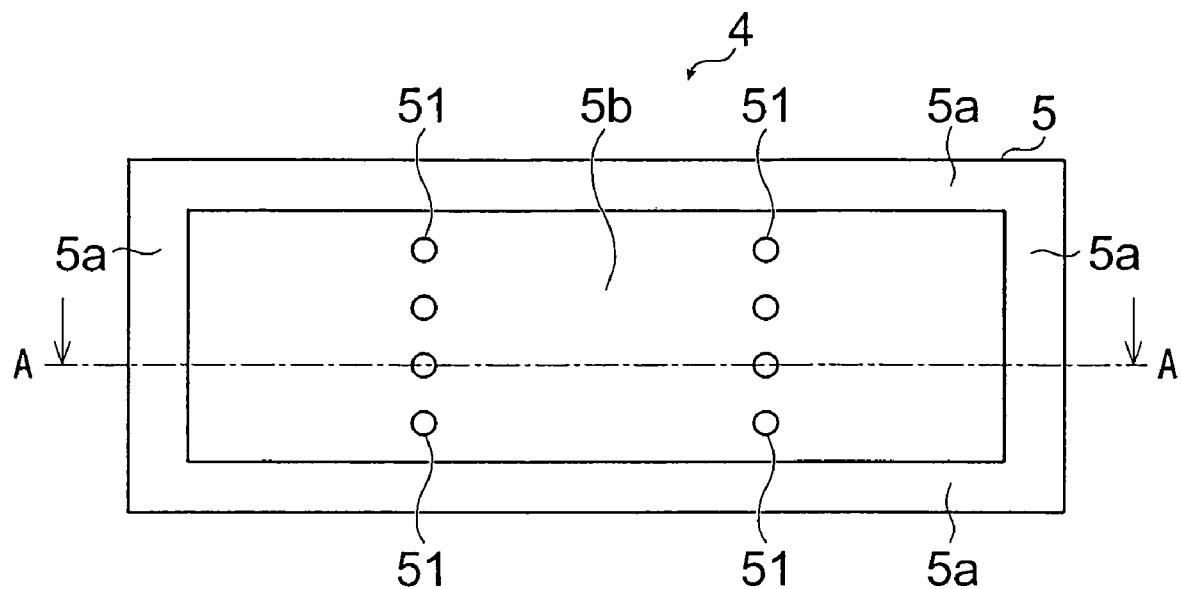
FIG. 7(a) is a plan view showing a head main body in accordance with an embodiment of the invention.
Figure 7B:
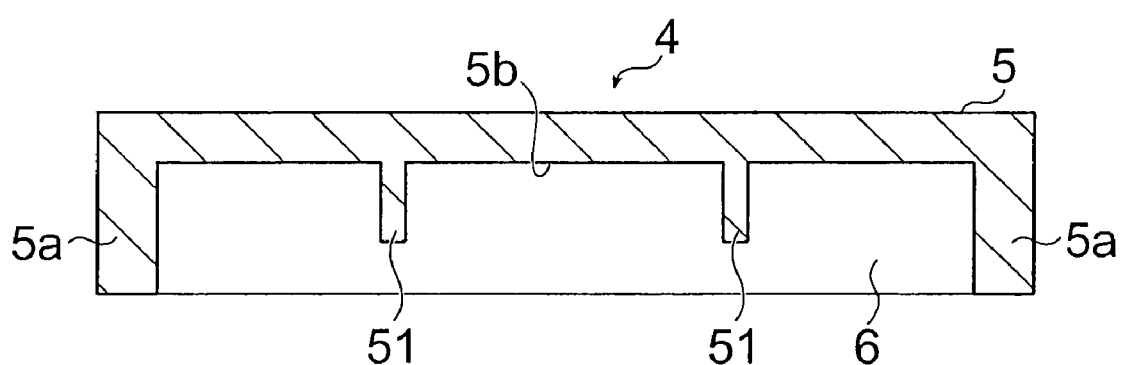
FIG. 7(b) is a cross-sectional view taken along the line A-A in FIG. 7(a).

Referring to FIGS. 7(a) and 7(b) of the invention, in accordance with an embodiment of the invention, a plurality of pressing force adjusting portions 51 having the form of protrusions extend from the concave portion 5b inside the pressing force adjusting frame 5a of the head main body 5.

The height of the pressing force adjusting portions 51 is shorter than that of the pressing force adjusting frame 5a surrounding the same. Accordingly, the pressing force adjusting portions 51 are buried inside the pressure bonding member 6.

In accordance with this embodiment, it is not required to prepare the thermocompression bonding heads 4 based on the number, allocation position, size or the like of the IC chip 20, and thermocompression bonding can be performed for a plurality of IC chips 20 simultaneously without positional displacement of the IC chips 20.

In embodiments of the invention described earlier, an IC chip is mounted using an anisotropic conductive adhesive film. However, the present invention is not limited to this. An adhesive agent that does not contain conductive particles may also be used.

Also, in embodiments of the invention described earlier, an IC chip having a bump electrode is mounted. However, an IC chip that does not include a bump electrode can also be used.

What is claimed is:

1. A mounting device for an electric component, comprising:
   a thermocompression bonding head including a pressure bonding member made of a predetermined elastomer and the pressure bonding member is provided in a head main body, and
   a pressing force adjusting mechanism for adjusting a pressing force corresponding to a region on a pressure bonding surface of the pressure bonding member, the pressing force adjusting mechanism having a frame-shaped pressing force adjusting portion provided on the edges of the head main body, the pressure bonding member being provided in a concave portion inside the frame-shaped pressing force adjusting portion and having a cut portion, provided on the surface thereof as the pressing force adjusting mechanism, wherein the pressure bonding member is pressed at a predetermined pressure toward an electric component placed on a wiring board.

2. A mounting device for an electric component, comprising:

a thermocompression bonding head including a pressure bonding member made of a predetermined elastomer and the pressure bonding member is provided in a head main body, and a pressing force adjusting mechanism for adjusting a pressing force corresponding to a region on a pressure bonding surface of the pressure bonding member, the pressing force adjusting mechanism having a frame-shaped pressing force adjusting portion provided on the edges of the head main body, and having the pressure bonding member provided in a concave portion inside the frame-shaped pressing force adjusting portion, the pressure bonding member being configured by combining a plurality of the pressure bonding members in an integral manner, the pressure bonding member comprising a plurality of integrally-bonded elastomeric members having a plurality of hardness values, wherein the pressure bonding member is pressed at a predetermined pressure toward an electric component placed on a wiring board.

3. A mounting device for an electric component, comprising:

a thermocompression bonding head including a pressure bonding member made of a predetermined elastomer and the pressure bonding member is provided in a head main body, and a pressing force adjusting mechanism for adjusting a pressing force corresponding to a region on a pressure bonding surface of the pressure bonding member, the pressing force adjusting mechanism comprising:

a frame-shaped pressing force adjusting portion provided on the edges of the head main body, the pressure bonding member being provided in a concave portion inside the frame-shaped pressing force adjusting portion, and a cut portion formed on the pressure bonding surface, the cut portion acting to adjust pressing force, wherein the pressure bonding member is pressed at a predetermined pressure toward an electric component placed on a wiring board.

* * * * *